US 6,879,204 B1

(12) United States Patent
Kanou

(10) Patent No.: US 6,879,204 B1
(45) Date of Patent: Apr. 12, 2005

(54) EXPONENTIAL CONVERSION CIRCUIT

(75) Inventor: Nobuo Kanou, Tokyo (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 10/745,166

(22) Filed: Dec. 23, 2003

(30) Foreign Application Priority Data

Sep. 26, 2003 (JP) ................................. P2003-336192

(51) Int. Cl.[7] .............................................. G06F 7/556
(52) U.S. Cl. ..................................................... 327/346
(58) Field of Search ........................ 327/103, 346–349, 327/355–356, 359, 561–563, 494, 496, 587–588; 708/277, 851

(56) References Cited

U.S. PATENT DOCUMENTS

| | | | | |
|---|---|---|---|---|
| 4,157,508 A | * | 6/1979 | Hecken | 327/346 |
| 5,506,536 A | * | 4/1996 | Yeung | 327/346 |
| 5,534,813 A | * | 7/1996 | DeMicheli | 327/346 |
| 6,771,111 B2 | * | 8/2004 | Sheng et al. | 327/346 |
| 6,777,999 B2 | * | 8/2004 | Kanou et al. | 327/346 |
| 2002/0070788 A1 | | 6/2002 | Kanou et al. | 327/346 |

FOREIGN PATENT DOCUMENTS

JP     2002-92541     3/2002

OTHER PUBLICATIONS

Kyoung–Hoi Koo, et al., "A New Impedance Control Circuit for USB 2.0 Transceiver," ESSCIRC 2001.

* cited by examiner

*Primary Examiner*—My-Trang Nu Ton
(74) *Attorney, Agent, or Firm*—DLA Piper Rudnick Gray Cary US LLP

(57) ABSTRACT

A first voltage conversion circuit converts first and second reference input voltages into first and second differential output voltage.

A second voltage conversion circuit converts the first reference input voltage and a control input voltage into a third differential output voltage.

The third differential output voltage is inputted to an exponential conversion element.

The first and second differential output voltages are inputted to an active impedance bridge. The active impedance bridge outputs a gain control voltage of the first and second voltage conversion circuits.

A balanced condition of the active impedance bridge determines the exponential conversion characteristic of the output current to the control input voltage of the exponential conversion element.

16 Claims, 4 Drawing Sheets

EXPONENTIAL CONVERSION CIRCUIT

CROSS REFERENCE TO RELATED APPLICATION

This application is based upon and claims the benefit of priority from the prior Japanese Patent Application No. 2003-336192, filed Sep. 26, 2003, the entire contents of which are incorporated herein by reference.

FIELD OF THE INVENTION

This invention relates to an exponential conversion circuit to output a current which varies exponentially according to input voltage.

DESCRIPTION OF THE BACKGROUND

In recent years, as demand of mobile communications represented by a portable telephone is expanded, a communication system having high efficiency in use of frequency is needed.

A Code Division Multiple Access (CDMA) system is one of the communication systems which meet the demand. In such a CDMA system, fine control of the transmitting electric power in a mobile station is required. Thus, it is necessary that a variable gain amplifier which is used in an IF (intermediate frequency) section operates to control a wide range gain of 70dB or more. In order to perform such wide range gain control, exponential change of the gain control signal level is necessary. Moreover, the gain control characteristic is desired to be stable independent on temperature. Also, it is required that a portable telephone should be small and lightweight. Integrated circuits are used in portable telephones to meet such requirements.

As shown in the U.S. Pat. Publication No. US2002/0070788 A1 (corresponding to Japanese Patent Publication (Kokai) P2002-92541), this and other inventors proposed an exponential conversion circuit using MOS transistors of a weak inversion area previously. The converting characteristic of the exponential conversion circuit is not influenced by temperature change. A CMOS type variable gain circuit using such an exponential conversion circuit was also proposed in the US Patent Publication.

The exponential conversion circuit shown in the US Patent Publication contains first and second voltage conversion circuits with controllable gains, a gain control voltage generating circuit and an exponential conversion element.

The first voltage conversion circuit has a gain control terminal, and converts first and second reference input voltages Vref1 and Vref2 to first and second differential output voltages.

The second voltage conversion circuit has the gain control terminal, and converts the first reference input voltage Vref1 and a control input voltage Vc to a third differential output voltage.

The gain control voltage generating circuit includes a pair of MOS transistors operating in weak inversion area and a current mirror circuit connected to the MOS transistors. The first and the second differential output voltages are inputted to the MOS transistors respectively, so that drain currents I1 and I2 flow in the MOS transistors. One of the drain voltages of the MOS transistors serves as the gain control voltage of amplification.

The third differential output voltage is inputted to the exponential conversion element.

The exponential conversion element transforms the third differential output voltage to the output current IOUT which varies exponentially.

When a size ratio of the MOS transistors constituting the current mirror circuit is expressed as m:n, the ratio of drain currents I1 and I2 is shown with the following expression.

$$I2/I1 = n/m \quad (1)$$

Therefore, the output voltage of the gain control voltage generating circuit varies according to this ratio m:n.

The third differential output voltage of the second voltage conversion circuit also varies according to this ratio m:n, because the gain of the second voltage conversion circuit is controlled by the gain control voltage.

Therefore, the logarithm of output current IOUT of the exponential conversion element which inputted the third differential output voltage is shown like a following expression with relation to the control voltage Vc.

$$ln(IOUT) = ln(I0) + \{\tfrac{1}{2} \cdot ln(n/m)/(Vref2 - Vref1)\} \cdot (Vc - Vref1) \quad (2)$$

Here, I0 is an inherent constant current of the voltage conversion circuits 1A and 1B.

Since inclination of the output current characteristic is determined by size ratio m:n of the MOS transistor of the current mirror circuit, inclination of the exponential conversion characteristic of the output current to control voltage may be influenced by the inclination of the output current characteristic as shown in the expression (2), when the size ratio varies according to manufacturing conditions etc.

As an example, a change of the output characteristic of output current IOUT (logarithm) to the control voltage Vc is shown in FIG. 1, when the size ratio m:n of MOS transistors shifts +10% or −10% from designed ratio.

As shown in the FIG. 1, when the size ratio m:n of the MOS transistors varies inclination of the exponential conversion characteristic of the output current to control voltage may change according to the variation of the size ratio.

SUMMARY OF THE INVENTION

One aspect of the present invention is to provide an exponential conversion circuit that comprises a first voltage conversion circuit converting first and second reference input voltages to first and second differential output voltages on the basis of a gain control signal, a second voltage conversion circuit converting the first reference input voltage and a first control input voltage to a third differential output voltage on the basis of the gain control signal, an exponential conversion element producing an output current which varies exponentially according to the third differential output voltage, and an impedance bridge including a first, a second, a third and a fourth transconductance elements and an amplifier, producing the gain control signal to provide to the first and second voltage conversion circuit according to the first and the second differential output voltages, the first transconductance element receiving the first differential output voltage, the second transconductance element receiving the second differential output voltage, the third transconductance element receiving the output voltage of the amplifier and the fourth transconductance element receiving a second control input voltage, the amplifier producing output voltage according to the difference between the output current of the first transconductance element and the output current of the second transconductance element.

DETAILED DESCRIPTION OF THE INVENTION

Figure 2:
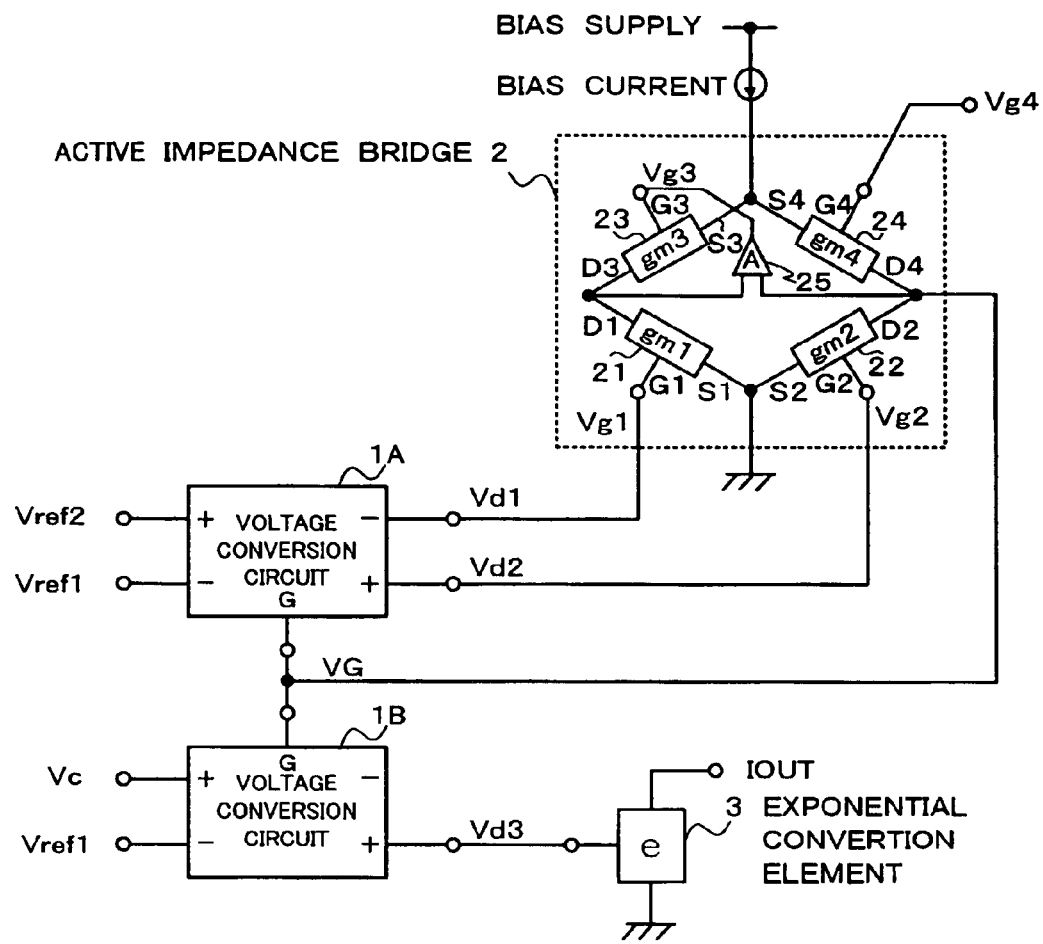
FIG. 2 is a block diagram showing an embodiment of an exponential conversion circuit according to the present invention.

FIG. 2 is a block diagram showing an embodiment of an exponential conversion circuit of the present invention.

The embodiment includes first and second voltage conversion circuits 1A and 1B, an active impedance bridge 2 and an exponential conversion element 3.

First voltage conversion circuit 1A is a differential amplification circuit which transforms two input reference voltages Vref1 and Vref2 into differential output voltages Vd1 and Vd2 based on a gain control signal VG. Second voltage conversion circuit 1B is a differential amplification circuit which transforms input reference voltage Vref1 and a control voltage Vc into a differential output voltage Vd3 based on gain control signal VG. Moreover, exponential conversion element 3 generates an output current IOUT which changes exponentially to differential output voltage Vd3. Thereby, output current IOUT varies exponentially to control voltage Vc.

Differential output voltages Vd1 and Vd2 of first voltage conversion circuit 1A are provided to active impedance bridge 2, and gain control signal VG of first and second voltage conversion circuits 1A and 1B is outputted from active impedance bridge 2.

Active impedance bridge 2 is provided with four transconductance elements 21–24 and amplifier 25. Transconductance elements 21–24 have terminals S1 to S4, D1 to D4 and G1 to G4 respectively.

Terminal S1 of transconductance element 21 is connected to a grounding terminal, and terminal D1 of transconductance element 21 is connected to terminal D3 of transconductance element 23. Terminal S2 of transconductance element 22 is connected to the grounding terminal, and terminal D2 of transconductance element 22 is connected to terminal D4 of transconductance element 24.

Differential output voltage Vd1 is provided to terminal G1 as an input voltage Vg1 of transconductance element 21, and the differential output voltage Vd2 is provided to terminal G2 as an input voltage Vg2 of transconductance element 22.

Terminal S3 of transconductance element 23 is connected to a bias power supply terminal, and terminal D3 of transconductance element 23 is connected to terminal D1 of transconductance element 21. Terminal S4 of transconductance element 24 is connected to the bias power supply terminal, and terminal D4 of transconductance element 24 is connected to terminal D2 of transconductance element 22.

The connection node of terminal D1 and terminal D3 is connected an input terminal of amplifier 25, and the connection node of terminal D2 and terminal D4 is connected another input terminal of amplifier 25. An output terminal of amplifier 25 is connected terminal G3 of transconductance element 23. Thus, an output voltage of amplifier 25 is given to transconductance element 23 as an input voltage Vg3.

On the other hand, terminal G4 of transconductance element 24 is connected to an external terminal, an inclination control voltage Vg4 of the exponential conversion characteristic is provided to transconductance element 24.

The output potential of terminal D1 to D4 are provided to amplifier 25. When the transconductances of transconductance elements 21–24 are gm1–gm4 respectively, amplifier 25 generates input voltage Vg3 of transconductance element 23 so that a balanced condition as gm2/gm1=gm4/gm3 may occur.

Figure 3:
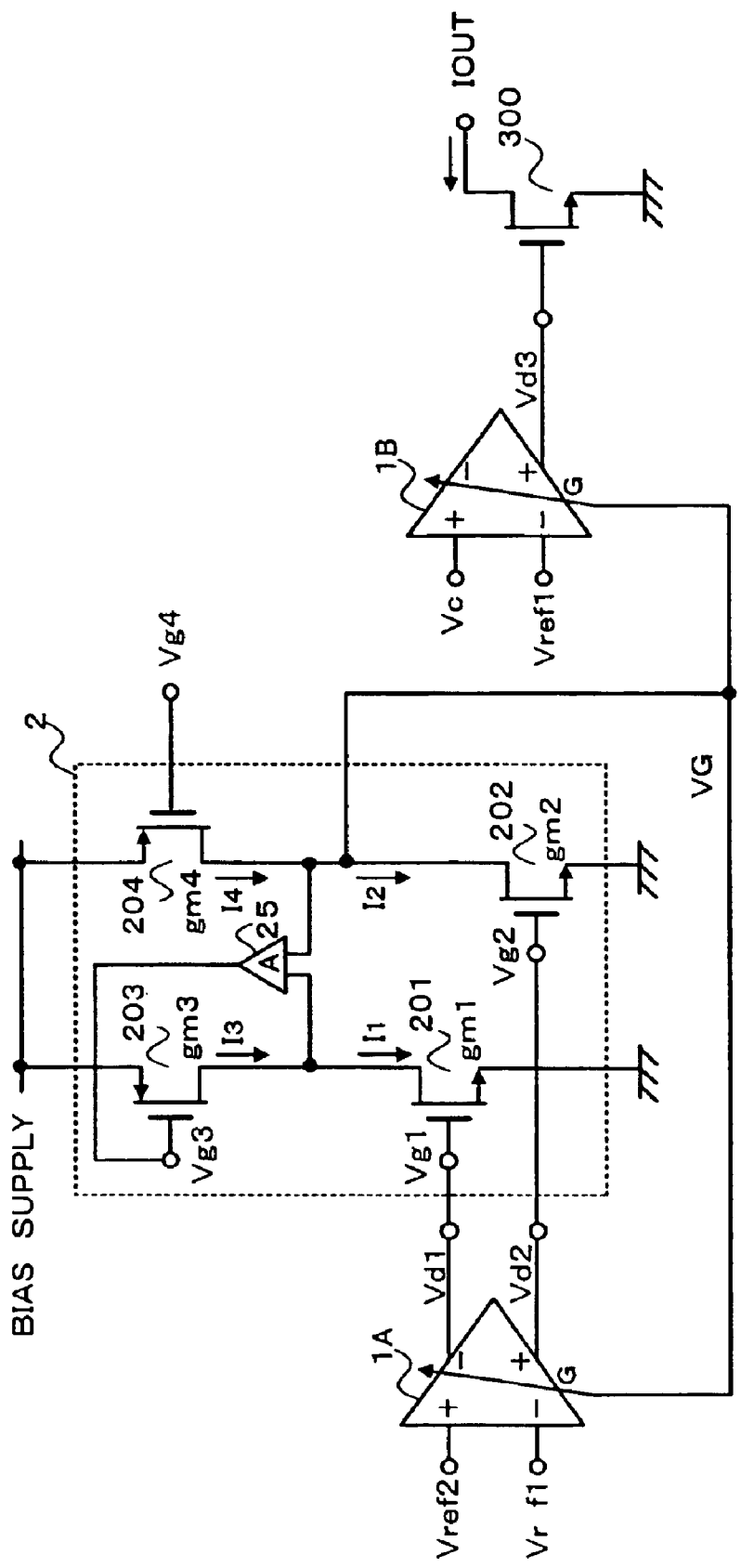
FIG. 3 is a circuit diagram showing an embodiment of an exponential conversion circuit according to the present invention.

FIG. 3 is a circuit diagram showing an embodiment of an exponential conversion circuit of the present invention, which uses MOS transistors 201–204 and 300 for the active impedance bridge 2 and the exponential conversion element 3.

MOS transistors 201–204 operating in a weak inversion area constitute active impedance bridge 2, and are equivalent to transconductance elements 21, 22, 23, and 24 in FIG. 2, respectively Moreover, a MOS transistor 300 operating in a weak inversion area operates as the exponential conversion element.

Drain currents are shown as I1, I2, I3 and I4, gate voltages are shown as Vg1, Vg2, Vg3 and Vcg4 f or the MOS transistors 201, 202, 203 and 204 respectively.

Active impedance bridge 2 generates Vg3 to apply feedback to the MOS transistor 203 by amplifier 25, so that balanced condition gm2/gm1=gm4/gm3 of active impedance bridge 2 may be maintained. Consequently, the following expression of relations is substantially realized between drain currents I1–I4.

$$I2/I1=I4/I3 \quad (3)$$

Among gate voltages Vg1–Vg4 following expression of relations is realized similarly $$Vg2/Vg1=Vg4/Vg3 \quad (4)$$

Therefore, in the circuit of FIG. 3, current ratio I2/I1 can be transposed to gate voltage ratio Vg4/Vg3.

Then, when n/m of the expression (2) is replaced by the gate voltage ratio Vg4/Vg3, the relation between the output current IOUT and the control voltage Vc in the circuit of FIG. 3 is shown as follows.

$$ln(IOUT)=ln(I0)+\{½·ln(Vg4/Vg3)/(Vref2-Vref1)\}·(Vc-Vref1) \quad (5)$$

As shown in the expression (5), the inclination of the exponential conversion characteristic of output current IOUT is determined by the gate voltage ratio Vg4/Vg3. Thus the inclination of change of output current IOUT can theoretically not be influenced by the variation in the size of MOS transistors. Moreover, the influence by temperature change is small in output current IOUT.

Figure 1:
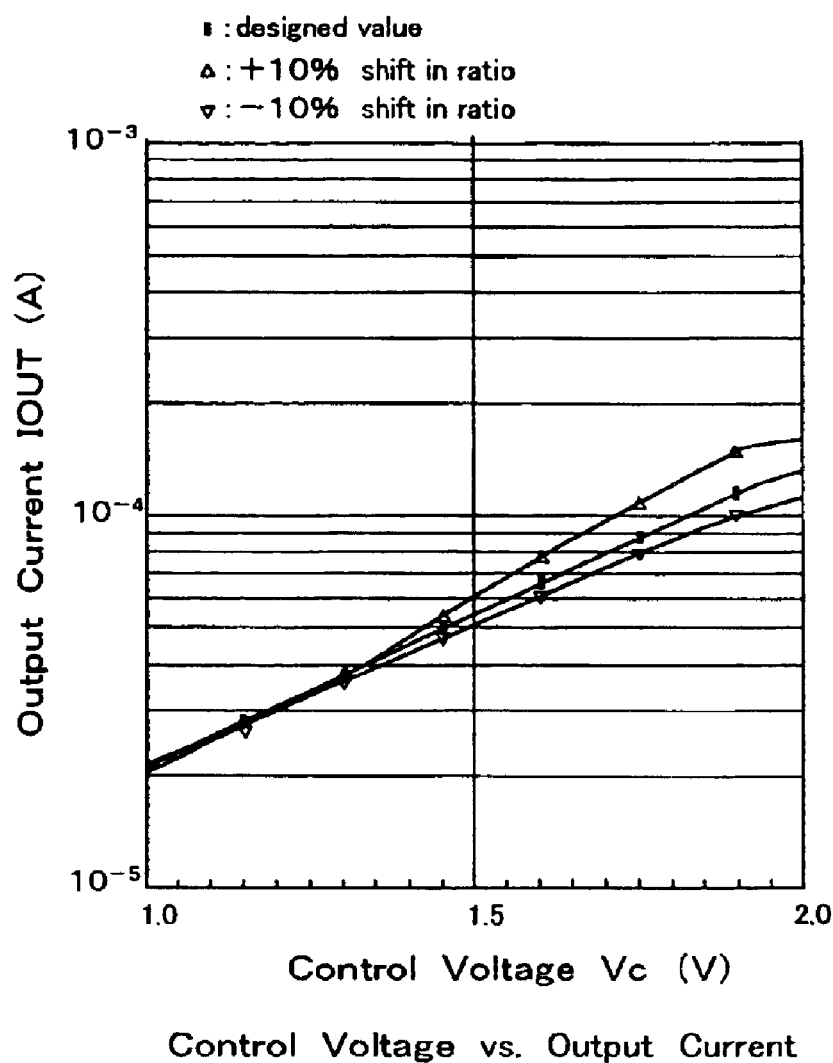
FIG. 1 is an output current characteristic of a known exponential conversion circuit.
Figure 4:
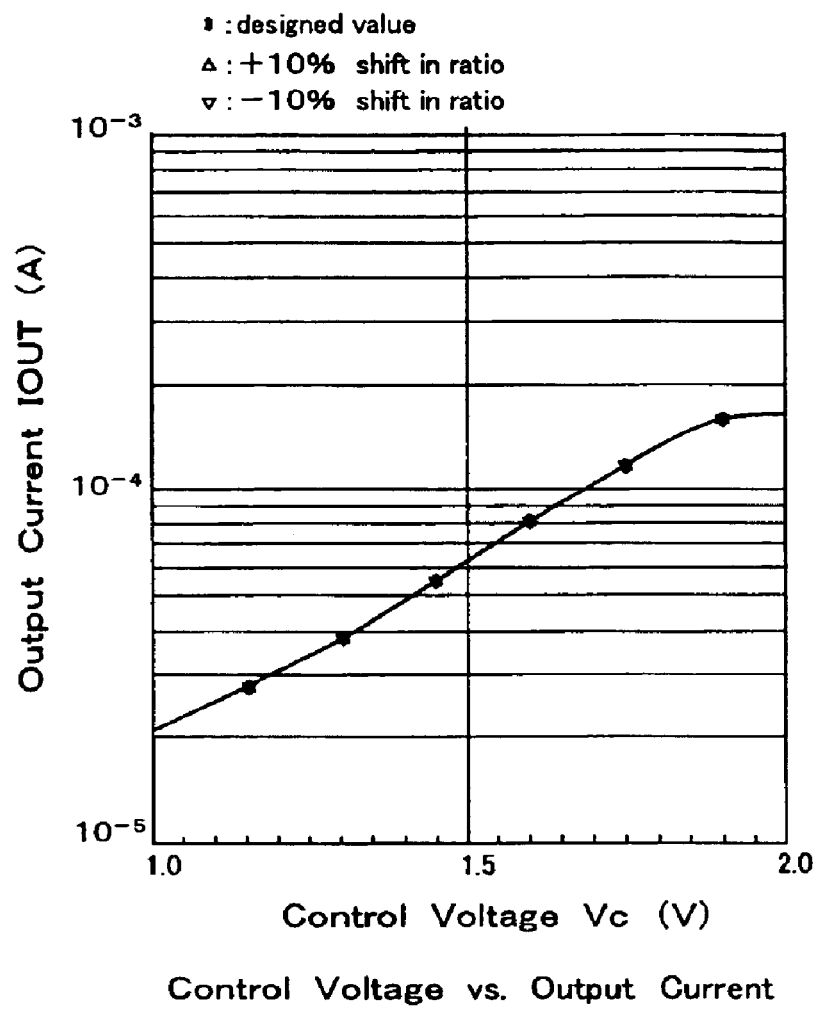
FIG. 4 is an output current characteristic of an embodiment of an exponential conversion circuit according to the present invention.

FIG. 4 is a graph which was obtained by carrying out a simulation of the output current IOUT(logarithm) to the control voltage Vc in the circuit of FIG. 3, and plotting the result. Here, the gate voltage Vg4 of the MOS transistor 204 is adjusted so that the inclination of change of output current may become the same as the graph of FIG. 1. Moreover, in order to observe the influence of the variation in the size of MOS transistors, the both simulation results are plotted at +10% and −10% the size ratio of the MOS transistors 203 and 204, which determines the inclination of the output current characteristic.

As shown in FIG. 4, the circuit of FIG. 3 suppresses deviation in inclination of the exponential conversion characteristic of the output current IOUT to the control voltage Vc even if deviation occurs in size of MOS transistors. As a result, the exponential conversion characteristic can be stable.

What is claimed is:

1. An exponential conversion circuit, comprising:
a first voltage conversion circuit configured to convert first and second reference input voltages to first and second differential output voltages on the basis of a gain control signal;
a second voltage conversion circuit configured to convert the first reference input voltage and a first control input voltage to a third differential output voltage on the basis of the gain control signal;
an exponential conversion element configured to produce an output current which varies exponentially according to the third differential output voltage; and
an impedance bridge including a first, a second, a third and a fourth transconductance elements and an amplifier configured to produce the gain control signal to provide to the first and second voltage conversion circuit according to the first and the second differential output voltages, the first transconductance element receiving the first differential output voltage, the second transconductance element receiving the second differential output voltage, the third transconductance element receiving the output voltage of the amplifier and the fourth transconductance element receiving a second control input voltage, and the amplifier producing the output voltage according to the difference between the output current of the first transconductance element and the output current of the second transconductance element.

2. The exponential conversion circuit according to claim 1, wherein the first) the second, the third and the fourth transconductance elements have a transconductance gm1, gm2, gm3, and gm4 respectively, and an equation gm2/gm1=gm4/gm3 is realized as a balanced condition.

3. The exponential conversion circuit according to claim 1, wherein the second control input voltage determines an inclination of the exponential conversion characteristic.

4. The exponential conversion circuit according to claim 2, wherein the second control input voltage determines an inclination of the exponential conversion characteristic.

5. The exponential conversion circuit according to claim 1, wherein the exponential conversion element includes a MOS transistor which operates in a weak inversion area.

6. The exponential conversion circuit according to claim 2, wherein the exponential conversion element includes a MOS transistor which operates in a weak inversion area.

7. The exponential conversion circuit according to claim 3, wherein the exponential conversion element includes a MOS transistor which operates in a weak inversion area.

8. The exponential conversion circuit according to claim 4, wherein the exponential conversion element includes a MOS transistor which operates in a weak inversion area.

9. The exponential conversion circuit according to claim 1, wherein the first, the second, the third and the fourth transconductance elements respectively includes a MOS transistor which operates in a weak inversion area.

10. The exponential conversion circuit according to claim 2, wherein the first, the second, the third and the fourth transconductance elements respectively includes a MOS transistor which operates in a weak inversion area.

11. The exponential conversion circuit according to claim 3, wherein the first, the second, the third and the fourth transconductance elements respectively includes a MOS transistor which operates in a weak inversion area.

12. The exponential conversion circuit according to claim 4, wherein the first, the second, the third and the fourth transconductance elements respectively includes a MOS transistor which operates in a weak inversion area.

13. The exponential conversion circuit according to claim 5, wherein the first, the second, the third and the fourth transconductance elements respectively includes a MOS transistor which operates in a weak inversion area.

14. The exponential conversion circuit according to claim 6, wherein the first, the second, the third and the fourth transconductance elements respectively includes a MOS transistor which operates in a weak inversion area.

15. The exponential conversion circuit according to claim 7, wherein the first, the second, the third and the fourth transconductance elements respectively includes a MOS transistor which operates in a weak inversion area.

16. The exponential conversion circuit according to claim 8, wherein the first, the second, the third and the fourth transconductance elements respectively includes a MOS transistor which operates in a weak inversion area.

* * * * *